United States Patent
Marshall et al.

(10) Patent No.: US 7,453,131 B2
(45) Date of Patent: Nov. 18, 2008

(54) PHOTODIODE DETECTOR AND ASSOCIATED READOUT CIRCUITRY

(75) Inventors: Gillian Fiona Marshall, Malvern (GB); David John Robbins, Malvern (GB); Weng Y Leong, Worcester (GB)

(73) Assignee: QinetiQ Limited, London (GB)

( * ) Notice: Subject to any disclaimer, the term of this patent is extended or adjusted under 35 U.S.C. 154(b) by 342 days.

(21) Appl. No.: 10/520,849

(22) PCT Filed: Jul. 3, 2003

(86) PCT No.: PCT/GB03/02851

§ 371 (c)(1), (2), (4) Date: Jan. 11, 2005

(87) PCT Pub. No.: WO2004/008537

PCT Pub. Date: Jan. 22, 2004

(65) Prior Publication Data

US 2005/0253132 A1 Nov. 17, 2005

(30) Foreign Application Priority Data

Jul. 11, 2002 (GB) .................................. 0216075.2

(51) Int. Cl.
*H01L 31/107* (2006.01)
(52) U.S. Cl. .................. 257/438; 257/460; 257/461; 257/E31.063
(58) Field of Classification Search ................ 257/438, 257/458, 461, E31.063, 460
See application file for complete search history.

(56) References Cited

U.S. PATENT DOCUMENTS 5,596,186 A * 1/1997 Kobayashi ............... 250/214.1

(Continued)

FOREIGN PATENT DOCUMENTS

| FR | 2 742 878 | 6/1997 |
|---|---|---|
| WO | WO 00/21280 | 4/2000 |

OTHER PUBLICATIONS

Xu et al, "A Low Voltage Hybrid Bulk/Soi CMOS Active Pixel Image Sensor" *IEEE Electron Device Letters*, pp. 248-250.
A.M. Moloney et al, "Small Signal Equivalent Circuit for Geiger-Mode Avalanche Photodiodes" *Electronics Letters*, pp. 285-286.

(Continued)

*Primary Examiner*—Marcos D. Pizarro
(74) *Attorney, Agent, or Firm*—Nixon & Vanderhye P.C.

(57) ABSTRACT

A photodetector circuit incorporates an APD detector structure (10) comprising a p– silicon handle wafer (12) on which a $SiO_2$ insulation layer (14) is deposited in known manner. During manufacture a circular opening (16) is formed through the insulation layer (14) by conventional photolithography and etching, and an annular p+ substrate contact ring (18) is implanted in the handle wafer (12) after opening of the window (16). The APD itself is formed by implantation of a p region (20) and an n+ region (22). After the various implantation steps a metallisation layer is applied, and annular metal contacts are formed by the application of suitable photolithography and etching steps, these contacts comprising an annular contact (26) constituting the negative terminal and connected to the p+ substrate contact ring (18), an annular metal contact (28) constituting the positive terminal and connected to the n+ region (22) of the APD, and source and drain contacts (30) and (32) (not shown in FIG. 1) connected to the source and drain of one or more CMOS MOSFET devices of the associated CMOS readout circuitry fabricated within a Si layer (34) formed on top of the insulation layer (14). Such an arrangement overcomes the problem of combining APDs with CMOS circuits in that APDs operate at relatively high reverse bias (15-30V) and CMOS circuits operate at low voltage (SV), and the arrangement must be such as to prevent the high bias voltage from affecting the operation of adjacent CMOS transistors.

16 Claims, 3 Drawing Sheets

U.S. PATENT DOCUMENTS

| | | |
|---|---|---|
| 5,786,615 A | 7/1998 | Saito |
| 6,072,224 A | 6/2000 | Tyson et al. |
| 6,204,087 B1 * | 3/2001 | Parker et al. .................. 438/56 |
| 2002/0024058 A1 | 2/2002 | Birch et al. |

OTHER PUBLICATIONS

Y. Noriyoshi et al, "An Integrated Photodetector-Amplifier Using A-SI P-I-N Photodiodes and Poly-SI Thin-Film Transistors" *IEEE Photonics Technology Letters*, pp. 319-321.

* cited by examiner

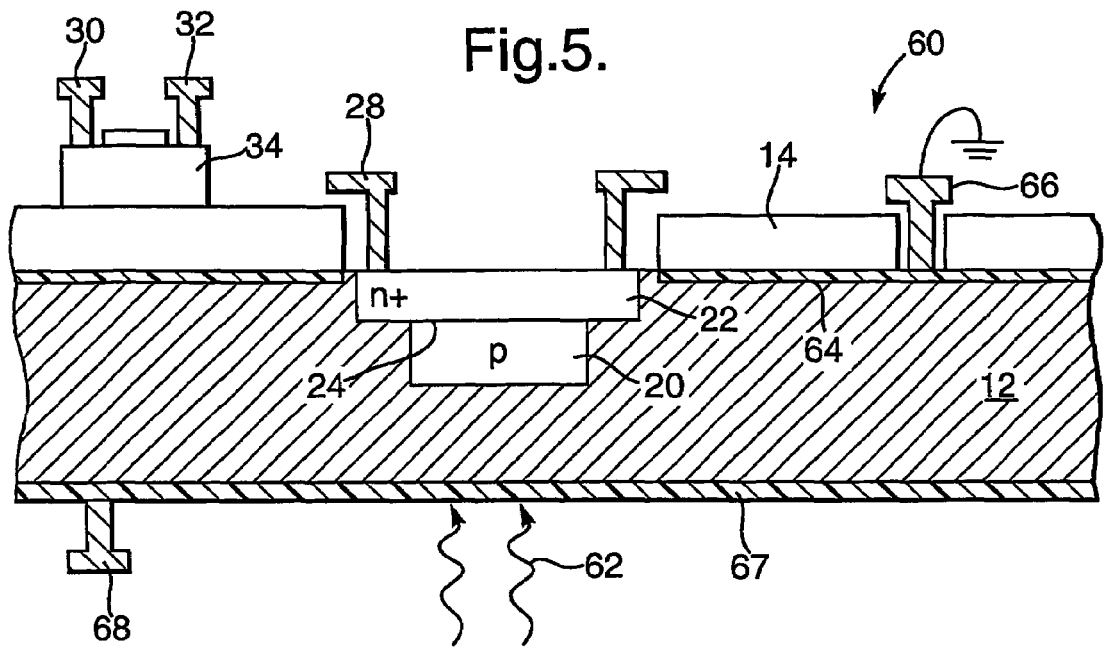
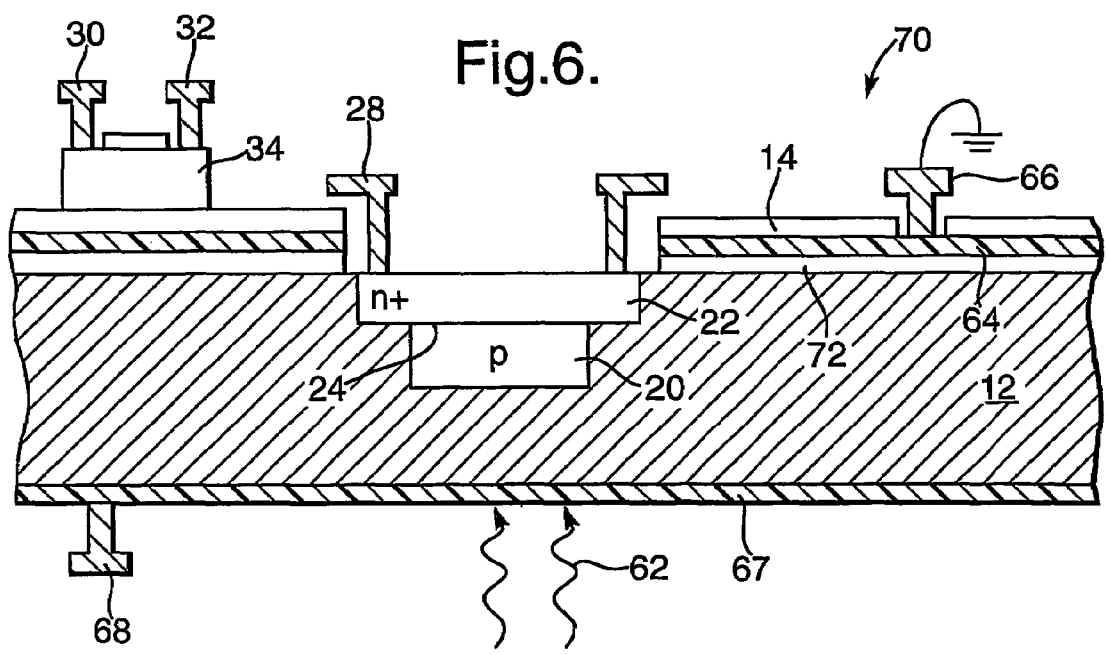

PHOTODIODE DETECTOR AND ASSOCIATED READOUT CIRCUITRY

This application is the U.S. national phase of international application PCT/GB2003/002851, filed in English on 3 Jul. 2003, which designated the US. PCT/GB2003/002851 claims priority to GB Application No. 0216075.2 filed 11 Jul. 2002. The entire contents of these applications are incorporated herein by reference.

This invention relates to photodetector circuits incorporating photodiode detectors and associated readout circuitry, and to methods of making such circuits and arrays incorporating such circuits.

There is a long-felt want for a photodetector circuit suitable for a solid state imaging system or camera operative under daytime and night-time conditions. Such a circuit should be capable of imaging in illuminating radiation intensities extending from direct sunlight down to sub-twilight, that is its illumination sensitivity should preferably extend over eight decades, or approach this range as nearly as possible, although not necessarily in a single operating mode. Its simultaneous dynamic range of illumination sensitivity, that is its illumination sensitivity in any one mode of operation, should preferably be at least four, and possibly six, decades, although for some applications, such as sub-twilight imaging, two or three decades of sensitivity would be adequate.

Another important consideration is whether or not a photodetector circuit is suitable for replication to provide an array of pixel circuits. This requires the circuits to be physically small, implementable as integrated circuits, and to have properties which are either accurately reproducible or adjustable to produce like properties. Discrete components such as operational amplifiers are too large to be incorporated in individual pixel circuits.

Existing technology cannot meet these objectives satisfactorily. Although photodetectors are known which consist of arrays of charge-coupled devices (CCDs) providing reasonable sensitivity to twilight levels of illumination if detector signals are integrated for longer than is normal, CCD camera images bloom and go into saturation (loss of image contrast) at high illuminating radiation intensities. Furthermore such photodetectors have poor simultaneous dynamic range (two or three decades) and consequently cannot resolve image features in both sunlight and shadow simultaneously, that is within the same image frame. In Proc SPIE pp. 19-29, Vol. 2172, "Charge Coupled Devices and Solid State Optical Sensors IV", January 1994, Mendis et al. discloses cameras with detectors in the form of arrays of silicon p-n diodes on complementary metal oxide/silicon-on-silicon substrates (CMOS-on-Si). Such detectors have performance similar to that of CCDs, i.e. with the same limitations on simultaneous dynamic range in particular, but they make it possible to operate at lower power consumption than a CCD array of comparable resolution.

In Proc Advanced Pocal Plane Arrays and Electronic Cameras 1996, "Random Addressable Active Pixel Image Sensors", Dierickx et al. discloses logarithmic CMOS imaging systems with photodiode detectors dealing with the dynamic range problem. These have a very high simultaneous dynamic range of up to six decades which allows imaging from twilight to direct sunlight. Unfortunately they are characterised by thermal noise and unwanted artefacts arising from mismatch of pixel circuit elements (MOSFETs) too severe to achieve imaging significantly below twilight. Some systems of this kind also have a bandwidth that is dependent on illumination level, thus causing the response to slow at low illuminating radiation intensities.

An avalanche photodiode (APD) detector array has been investigated for use in imaging systems by A. Biber and P. Seitz, and is reported in the Proceedings of the IS&T/SPIE Conference on Sensors, Cameras and Systems for Scientific/Industrial Applications, California 1999, pp. 40-49. This reference discloses APDs produced using Si-CMOS technology (implantation or diffusion) and biased into a sub-geiger mode of operation. Unfortunately it has been found that it is difficult to produce APD detector arrays in which the APDs are sufficiently small and uniform to provide acceptable resolution and image quality.

US Published Application No. 2002/0024058A1 discloses a photodetector circuit including a photodiode detector and associated readout CMOS circuitry, in which an active region of the photodiode detector is formed by at least one epitaxial layer, and a guard ring is provided to delimit the photodiode detector in order to enhance electrical field uniformity and inhibit premature breakdown. The provision of the epitaxial layer provides a number of improvements in photodiode characteristics combined with the low cost of CMOS technology, whilst the guard ring reduces the scope for localised high electric fields and improves breakdown characteristics. The CMOS component may be a substrate and CMOS circuitry supported by and insulated from the substrate, and the photodiode detector may be operable in a current multiplication mode and comprise at least one region epitaxially deposited upon the substrate. The photodiode detector may be a PIN structure, or an avalanche photodiode comprising a first region of one conductivity type incorporated in the substrate, a second region of opposite conductivity type being provided by the epitaxial layer.

It is an object of the invention to provide improvements in such photodetector circuits.

According to one aspect of the present invention there is provided a photodetector circuit including a photodiode detector and associated readout circuitry, the circuit comprising a semiconductor handle substrate of one conductivity type supporting the readout circuitry, and an insulating layer on the handle substrate electrically insulating the readout circuitry from the substrate, and the photodiode detector comprising an avalanche photodiode having a first active region of the opposite conductivity type to the handle substrate incorporated in the handle substrate and a second active region of said one conductivity type incorporated in the handle substrate so as to define an active electrooptical junction within the handle substrate between the first and second active regions.

The readout circuitry preferably comprises at least one MOS component on a substrate, for example a MOSFET transistor compatible with CMOS processing and operated in the subthreshold response region, thereby having a logarithmic response.

Such an arrangement overcomes the problem of combining APDs with CMOS circuits in that APDs operate at relatively high reverse bias (15-30V) and CMOS circuits operate at low voltage (5V), and the arrangement must be such as to prevent the high bias voltage from affecting the operation of adjacent CMOS transistors. Whilst it is possible for the required electrical isolation to be provided in bulk silicon wafers by forming doping wells in the substrate, this type of isolation creates restrictions on device and circuit design. By contrast the invention proposes forming the APDs in the handle wafer (typically approximately 600 μm thick), and forming the CMOS readout circuit in a thin silicon layer (typically about 300 nm thick) on top of an oxide layer (typically about 500 nm thick) formed on the wafer, so that the transistors and the APDs are electrically isolated by the oxide layer.

The use of silicon-on-insulator (SOI) substrates allows the characteristics of the CMOS circuits and the APDs to be separately optimised. In particular the feature size of the CMOS transistors can be made smaller to reduce power consumption and/or to increase complexity and functionality of the readout circuits. This separate optimisation of readout and detector devices is not possible if the sensor is fabricated on a bulk silicon wafer using well isolation using a standard CMOS foundry process.

APDs provide internal gain at bias voltages which are close to the breakdown voltage through the mechanism of avalanche multiplication of the carriers. Thus greater sensitivity can be obtained at low light intensity by use of APDs as compared with conventional photodiodes. In conventional APDs the device current increases very rapidly as the applied bias approaches the breakdown voltage. This steep I-V characteristic is unfavourable for array sensors because small variations in the device characteristics or in the applied bias generate large changes of internal gain in the detector. This can give rise to fixed pattern noise in the sensor.

In a development of the invention at least one epitaxial layer is provided on the first active region to provide a resistance in series with the photodiode detector to control the voltage characteristic of the photodiode detector, that is to soften the breakdown characteristic. The integrated series resistance limits the current near breakdown. Integration of the series resistance vertically above the avalanche region of the APD avoids the need to increase pixel area to incorporate an external resistor, and is therefore an efficient use of chip area for a photodetector array incorporating a large number of such circuits.

According to a further aspect of the invention there is provided a photodetector circuit including a photodiode detector and associated readout circuitry, the circuit comprising a semiconductor handle substrate of one conductivity type supporting and electrically insulated from the readout circuitry, and the photodiode detector comprising a first active region of the opposite conductivity type to the handle substrate incorporated in the handle substrate, a second active region of said one conductivity type incorporated in the handle substrate so that the first and second active regions form a diode, and at least one epitaxial layer on the substrate providing a resistance in series with the diode to control the voltage characteristic of the diode.

According to a further aspect of the present invention there is provided a photodetector circuit including a photodiode detector and associated readout circuitry, the circuit comprising a semiconductor substrate supporting and electrically insulated from the readout circuitry, and a photodiode detector having an active electrooptical junction incorporated in a thinned portion of the substrate so as to detect light which is incident on a back surface of the substrate and which is not received by the readout circuitry.

When an APD is made in the handle wafer of an SOI substrate, the volume of material from which photo-generated carriers can be collected is potentially larger than when doping wells are used for isolation. However, if the photodetector circuit is illuminated from the front side, the readout circuitry must be covered by an opaque light shield to prevent the generation of spurious currents by light incident on such circuitry. Such a light shield is disadvantageous, however, since it reduces the chip area for absorbing light and contributing to the photocurrent of the detector, so that the fill factor of the sensor is reduced. On the other hand, if the sensor is illuminated from the back side, the whole of the handle wafer can be illuminated so as to increase the fill factor. In this case the readout circuitry on the front side of the sensor must still be protected from incident light, and this can be achieved, in accordance with a development of the invention, by providing a buried light-shielding layer, made of tungsten silicide for example, within the substrate. The handle wafer must be thinned from the back side to a thickness much less than a typical starting thickness of such a wafer.

The photodetector circuit can be made to respond to wavelengths of greater than 1 μm if the handle wafer of the SOI substrate incorporates a semiconductor other than silicon. For example the substrate may incorporate SiGe alloy to provide a response in the short wavelength infrared region which is beneficial for detection under starlight conditions. A response at wavelengths greater than 1 μm is useful for some product inspection applications and for eye-safe operation.

The invention also provides a method of making a photodetector circuit incorporating a photodiode detector and associated readout circuitry, the method including the steps of providing an electrically insulating layer on a semiconductor handle substrate of one conductivity type, forming the readout circuitry on top of the insulating layer, forming a window in the insulating layer, and forming the photodiode detector within the window by implanting a first active region with dopant of the opposite conductivity type to the handle substrate, and implanting a second active region with dopant of said one conductivity type so as to define an avalanche photodiode within the handle structure.

The invention further provides a method of making a photodetector circuit incorporating a photodiode detector and associated readout circuitry, the method including the steps of providing an electrically insulating layer on a semiconductor substrate, forming the readout circuitry on top of the insulating layer, forming the photodiode detector on the substrate, and thinning the substrate in the vicinity of the photodiode detector so as to enable the photodiode detector to detect light which is incident on a back surface of the substrate and which is not received by the readout circuitry.

In order that the invention may be more fully understood, embodiments of the invention will now be described, by way of example, with reference to the accompanying drawings in which:

FIGS. 3, 4, 5 and 6 are vertical sections through second, third, fourth and fifth embodiments respectively.

Figure 1:
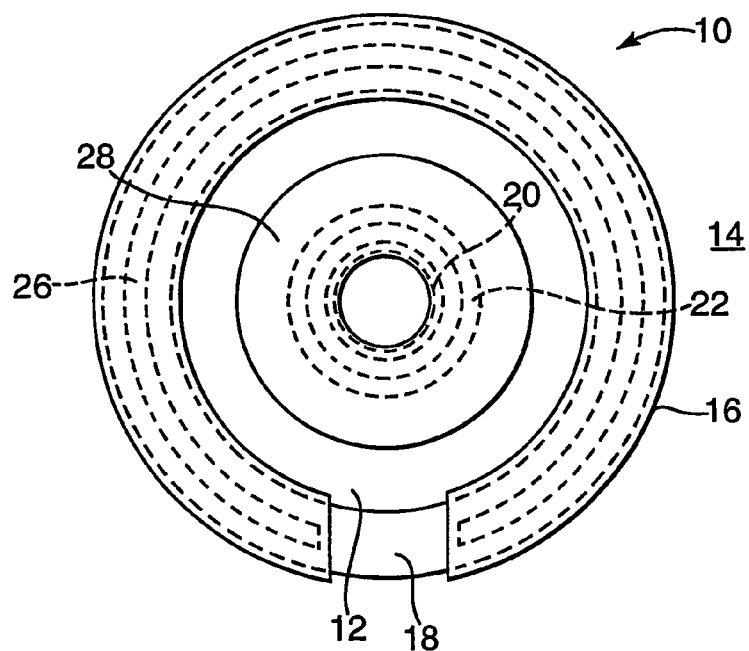
FIG. 1 is a plan view of the photodiode detector in a first embodiment.
Figure 2:
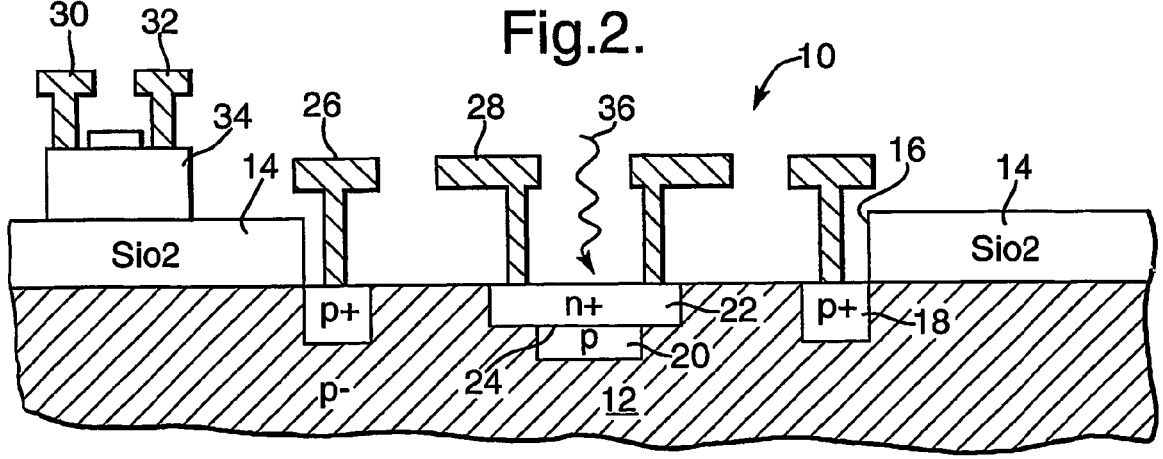
FIG. 2 is a vertical section through the first embodiment.

FIGS. 1 and 2 relate to a first embodiment of integrated photodetector circuit in accordance with the invention in which the photodiode detector is an APD detector, and the associated readout circuit is fabricated using CMOS technology. Other integrated photodetector circuits of this type are described in U.S. 2002/0024058A1 to which reference should be made with regard to possible variations which may be applied to the basic structure described in the method of manufacturing such a structure.

Referring to FIGS. 1 and 2, there is shown an APD detector structure 10 comprising a p− silicon handle wafer 12 on which a $SiO_2$ insulation layer 14 is deposited in known manner. During manufacture an opening 16 is formed through the insulation layer 14 by conventional photolithography and etching, and an annular p+ substrate contact ring 18 is implanted in the handle wafer 12 after opening of the window 16. The APD itself is formed by implantation of a p region 20 and an n+ region 22 which is illuminated by incident light as shown by the arrow 36 in FIG. 2, the active area of the APD (i.e. the region of high field for avalanche multiplication) being defined at the junction 24 between the regions 20 and 22.

After the various implantation steps in the method of manufacturing the APD detector structure 10, a metallisation layer is applied, and annular metal contacts are formed by the application of suitable photolithography and etching steps, these contacts comprising an annular contact 26 constituting the negative terminal and connected to the p+ substrate contact ring 18, an annular metal contact 28 constituting the positive terminal and connected to the n+ region 22 of the APD, and source and drain contacts 30 and 32 (not shown in FIG. 1) connected to the source and drain of one or more CMOS MOSFET devices of the associated CMOS readout circuitry fabricated within a Si layer 34 formed on top of the insulation layer 14, as described in U.S. 2002/0024058A1.

In the plan view of FIG. 1 (which omits the CMOS readout circuitry), certain areas such as the n+ region 22, are shown as though transparent so as to reveal underlying areas, such as the p region 20, in order to more clearly illustrate the device structure. However it will be appreciated that these areas would not normally be directly visible in the finished device.

In this APD detector structure 10 the provision of the substrate contact ring 18 ensures a localised electrical contact to the negative terminal of the APD from the top side of the wafer. The insulation layer 14 ensures that the CMOS readout circuitry fabricated on top of the insulation layer 14 is electrically insulated from the APD detector so that higher voltages (of the order of minus 15-25V) may be applied to the APD by the contact 26 than the voltages of 5V typically applied to the CMOS readout circuitry. The window 16 in the insulation layer 14 may be formed by plasma etching to expose the bare silicon of the handle wafer. Separate masks are used to implant and pattern the cathode and anode of the APD and associated contacts to the mask used to form the CMOS transistors of the readout circuitry in order to allow separate optimisation of the doping levels for the APD and the CMOS circuitry.

An APD has four possible modes of operation depending on the magnitude of its reverse bias voltage. At very low bias voltage, ignoring leakage current, electron-hole pairs are created as ionisation caused by incident photons. A proportion of these electron-hole pairs recombine in the active region of the photodiode and the remainder are transported by the bias field to contribute to the current. The current in the photodiode is proportional to the bias voltage, because increased bias increases carrier velocity and reduces time for recombination. At higher (but still low) bias voltage, the bias field becomes high enough to ensure that virtually all photo-ionised charged carriers are collected without recombination and the photodiode current is largely independent of the bias. At intermediate bias voltage, charge carriers created by incident photons are accelerated sufficiently to cause collision ionisation producing further carriers, i.e. current multiplication, and the current in the photodiode is substantially proportional to both the bias voltage and the incident photon flux, so that such current can be utilised in an imaging system to provide an indication of greyscale. At high bias voltage, photo-ionised charge carriers are accelerated sufficiently so that ionisation overcomes the recombination losses of the photodiode, leading to a breakdown current which is substantially independent of the incident photon flux (so that such current cannot be utilised in an imaging system to provide an indication of greyscale). The high and intermediate bias modes are often referred to as the Geiger and sub-Geiger modes by analogy with the well-known Geiger tube.

In operation of the photodetector circuit of FIGS. 1 and 2, the APD is operated in the sub-Geiger or intermediate bias mode and therefore has bias-dependent current and gain. Since the gain of the APD is controlled by its reverse bias voltage, it is possible to introduce additional gain as and when required in response to low incident radiation intensity. For example a gain of 30 may be chosen for an APD safely biased below its electrical breakdown field. At higher illumination levels a low bias is used and the APD is operated below avalanche in a conventional pn diode mode. Such adjustable detector gain produces the important advantage of providing a solid state detector which is able to operate over an extended range of illumination levels, whilst continuing to provide information about scene contrast.

Such photodetector circuits may be provided in arrays of such circuits with each circuit being associated with a pixel of the array, and with individual pixels being independently addressable in known manner by way of the associated readout circuitry. Not only does such a photodetector circuit enable the APD response range to be moved up and down to cover a greater total range of incident radiation intensities, but it also ensures that the response is substantially uniform over all the circuits of the array. Where such an array of photodetector pixel circuits is to be used in a solid state imaging system or camera operative under daytime and night-time conditions, the gain may be different during daytime and night-time, with greater gain and sensitivity at night.

Although the breakdown voltages of such APDs have been found to be relatively low, that is less than 15V, the standard deviation of APD gain over a number of such photodetector circuits is relatively large indicating that the breakdown is too steep and that the gain uniformity is not good enough for use in arrays of tens of thousands of pixels, such as may be required for many imaging applications. When a high bias is applied to the APD, a back-bias is generated in the associated CMOS readout circuitry, although the effect of such bias on the threshold voltage of the circuitry is acceptable. The dark count rate of single-photon avalanche diode (SPAD) devices made in this manner has been found to be low.

Figure 3:
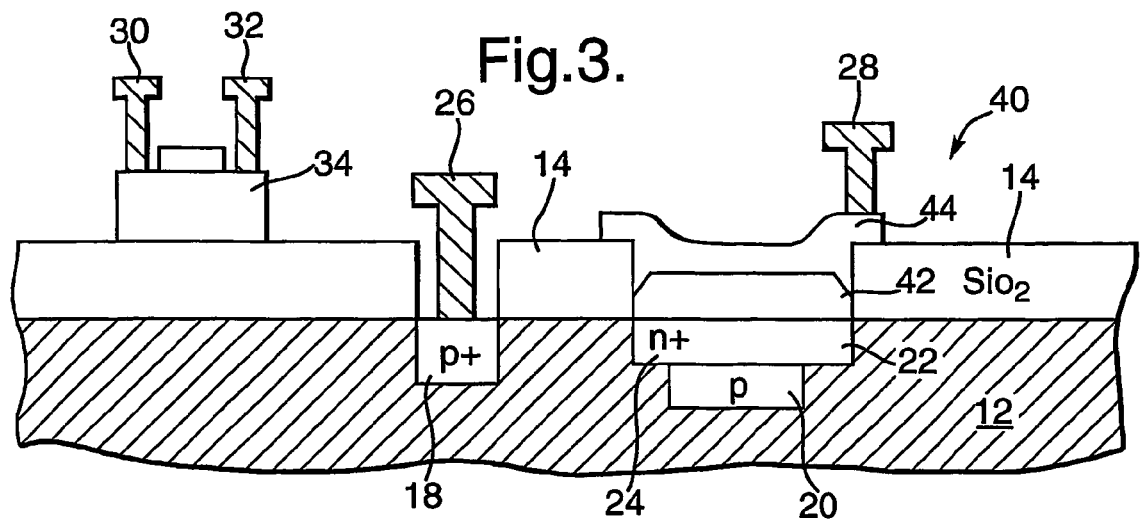

Referring now to FIG. 3 a photodetector circuit 40 is shown in which like parts are denoted by the same reference numerals as in FIG. 2, but in which two epitaxial layers 42 and 44 are grown on top of the APD in order to provide an integrated series resistance which has the effect of making the slope of the I-V curve approaching breakdown less steep, thus rendering the photodetector circuit more suitable for use in arrays of such circuits. Layer 44 is substantially epitaxial where it overlies epitaxial layer 42, but is polycrystalline where it overlies the insulation layer 14.

The upper epitaxial layer 44 is doped to be of the same conductivity type (n) as the n+ region 22 of the APD, and the lower epitaxial layer 42 is undoped so as to provide a higher resistance. The positive terminal metal contact 28 is connected to the upper epitaxial layer 44, the lower epitaxial layer 42 being connected to the contact 28 through the upper epitaxial layer 44 so that the higher resistance layer 42 forms a current-limiting resistor in series with the avalanche region of the APD. The potential of the region 22 floats towards that of the positive terminal metal contact 28 when a bias is applied.

It is a further advantage of such an arrangement that the epitaxial series resistance is integrated vertically with the APD, thus saving on pixel area as compared with an alternative arrangement in which a separate resistor is fabricated alongside the APD. Furthermore the arrangement is relatively insensitive to defects created during the epitaxial growth process since the electric fields across the lower epitaxial layer 42 are relatively low.

Figure 4:
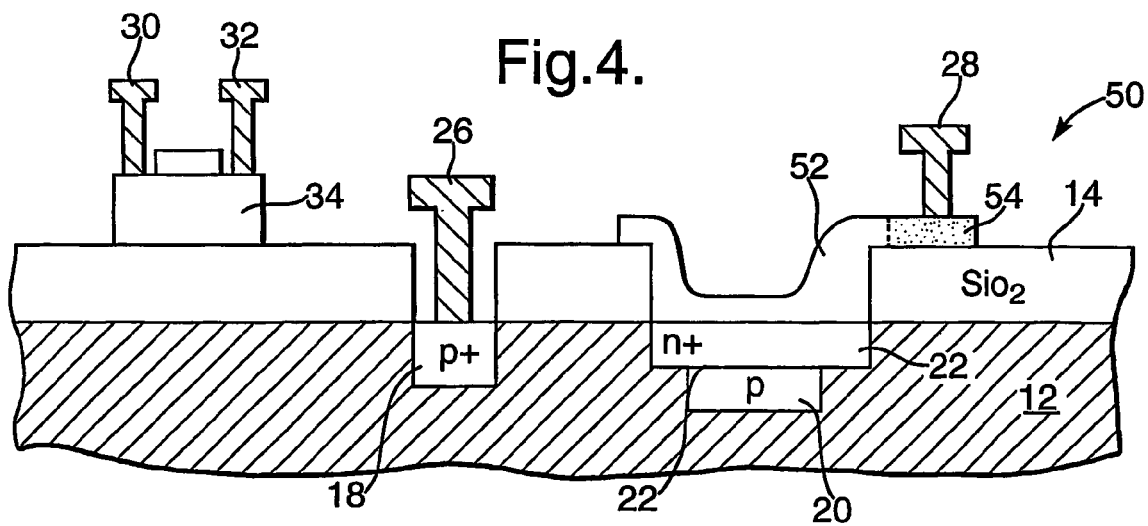

FIG. 4 shows a photodetector circuit 50 which is a variant of such an embodiment and in which the lower epitaxial layer is dispensed with and a polycrystalline layer 52 is grown directly on top of the APD, either epitaxially or using a conventional CMOS process step. In this case it may be appropriate for the contact area 54 of the layer 52 to be selectively implanted with a dopant in order to make good ohmic contact.

FIG. 5 shows an embodiment of a photodetector circuit 60 in which the APD is illuminated from the back of the wafer as shown by the arrows 62 (as opposed to the front of the wafer as in the previously described embodiments and as shown by the arrow 36 in FIG. 2). Such an arrangement requires the wafer to be thinned from the back after fabrication of the APD and associated readout circuitry so as to allow the light incident on the back of the wafer to reach the active area of the APD. Furthermore a buried light-shielding layer 64 of silicide is provided to prevent light from the back of the wafer being incident on the readout circuit and adversely affecting its operation. The light shielding layer 64 does not contact the n+ region 22. In this case the light-shielding layer 64 may also be connected to earth by way of a metal earth contact 66 extending through the insulation layer 14 so as to electrically shield the CMOS readout circuitry from the effect of any capacitive coupling to the back of the gate of the or each MOSFET (which might otherwise adversely affect the performance of the readout circuitry in spite of the presence of the insulation layer 14).

The preferred way of forming the buried light shielding layer 64 is by bonding two wafers, one of the wafers comprising a silicon wafer on which a layer of $SiO_2$ has been grown, and the other wafer comprising a p– doped silicon wafer on which there has been grown a layer of conductive silicide and subsequently a layer of $SiO_2$ on top of the layer of silicide. Preferentially, the second wafer has a p+ doped layer 67 of silicon which is used as part of an etch stop layer. The $SiO_2$ layers of the two wafers are bonded together in known manner so as to produce the required layer structure of FIG. 5 in which the light shielding layer 64 of silicide is provided between the bulk silicon 12 of one of the wafers and the silicon layer 34 of the other wafer (the insulation layer 14 being formed by the abutted $SiO_2$ layers of the two wafers). The handle wafer is backthinned in a conventional manner after device processing, stopping at the p+ doped layer 67.

In this embodiment the conductive contact to the negative terminal of the APD is preferably made by way of a metal contact 68 connected to the p+ doped layer 67 epitaxially applied to the back of the device. As a result of the provision of front and back metal contacts in this manner, the applied bias fields extend perpendicularly from back to front, as opposed to the case where all the contacts are provided on the same side of the wafer in which case lateral bias fields are produced.

In a further alternative embodiment (not illustrated) the positive terminal metal contact 28 can be continuous across the n+region 22, in order to reflect unabsorbed long wavelength light incident passing through the layers 67 and 12 back into the avalanche photodiode, thereby increasing the absorption efficiency.

FIG. 6 shows a photodetector circuit 70 which is a variant of such an arrangement and in which like parts are denoted by the same reference numerals as in FIG. 5. In this variant the light-shielding layer 64 of silicide is provided between two insulation layers 14 and 72 of $SiO_2$. This variant is again formed by bonding together of two wafers, but, in this case, with the second wafer having three successive layers, respectively of $SiO_2$, silicide and $SiO_2$ grown on its upper surface and a p+ doped layer within the substrate, which is used as part of an etch-stop layer for the back thinning. The uppermost $SiO_2$ layer of the second wafer is bonded to the $SiO_2$ layer of the first wafer so as to form the structure of FIG. 6 in which the light-shielding layer 64 is sandwiched between two insulation layers 14 and 72 (the layer 14 comprising contributions from both of the bonded $SiO_2$ layers of the two wafers).

The combination of the back illumination and the light-shielding layers in these embodiments provides greater detection sensitivity, as a result of the fact that the readout circuits are not adversely affected by light falling on the circuits, whilst enabling the fill factor, that is the percentage of the pixel responsive to illumination, to be made as large as possible, e.g. close to 100%. Such back illumination combined with light-shielding may be used with an advantage in the other embodiments described in place of a light-shielding layer covering the CMOS readout circuitry where the device is illuminated from the front which tends to limit the fill factor of the device.

In any of the above described embodiments it is possible to employ silicon-germanium (SiGe) alloy material in order to increase the operating wavelength in the APD. In this case the active region of the APD may be provided within the SiGe alloy material, rather than within the underlying Si substrate. The SiGe could be incorporated in the device in two ways. In a first alternative the fully strained SiGe is incorporated in the handle wafer as a series of thin layers capped by an unstrained Si layer. In order to avoid strain relaxation during bonding each of the SiGe layers should be kept below the equilibrium critical thickness for strain relaxation, which will reduce the long wavelength absorption efficiency. Subsequent processing of the structure will be similar to that for a bulk Si structure as already described.

In the second alternative a strain-relaxed, cubic SiGe alloy layer can be grown to any desired thickness on the Si handle wafer by introducing a graded-composition SiGe layer in which dislocations relax the strain. Such a cubic SiGe layer will absorb efficiently at wavelengths greater than the Si band gap. Furthermore a thin Si layer can be grown on the relaxed SiGe layer and subsequently oxidised to form $SiO_2$ to provide the SiGe handle wafer for bonding. This type of relaxed SiGe handle wafer will have some threading dislocations extending through it from the graded (dislocated) region to the surface, and these defects increase the leakage current of devices fabricated in the handle wafer.

In either of these two alternatives the APD may be fabricated in the SiGe handle wafer using implantation and annealing as described above with reference to FIGS. 1 and 2. Where either of these alternatives is used in a back-illuminated photodetector circuit incorporating a light-shielding layer as described above with reference to FIGS. 5 and 6, the graded SiGe layer can be p+ doped to form the back contact (the underlying Si wafer being mostly removed in the back-thinning process so that it is not substantially present in the final device). Doping of the graded SiGe layer can be used to eliminate the bias field in the heavily dislocated region and reduce leakage current due to defects.

The invention claimed is:

1. A photodetector circuit including a photodiode detector and associated readout circuitry, the circuit comprising a semiconductor handle substrate of one conductivity type supporting the readout circuitry, and an insulating layer on the handle substrate electrically insulating the readout circuitry from the substrate, and the photodiode detector comprising an avalanche photodiode having a first active region of the opposite conductivity type to the handle substrate incorporated in the handle substrate and a second active region of said one conductivity type incorporated in the handle substrate so as to define an active electrooptical junction within the handle substrate between the first and second active regions, wherein there is at least one epitaxial layer on the first active region to provide a resistance in series with the photodiode detector to control the voltage characteristic of the photodiode detector.

2. A photodetector circuit according to claim 1, wherein the insulating layer on the handle substrate comprises $SiO_2$.

3. A photodetector circuit according to claim 1 or 2, wherein the readout circuitry comprises at least one MOS component.

4. A photodetector circuit according to claim 1, wherein there are two epitaxial layers comprising a lower epitaxial layer on the first active region which is substantially undoped so as to provide a high resistance and an upper epitaxial layer on the lower epitaxial layer which is of the same conductivity type as the first active region.

5. A photodetector circuit according to claim 1, wherein the or each epitaxial layer is provided within a window in the insulating layer.

6. A photodetector circuit according to claim 1, wherein a metal contact is connected to said at least one epitaxial layer.

7. A photodetector circuit according to claim 6, wherein the metal contact is connected to a selectively doped part of said at least one epitaxial layer.

8. A photodetector circuit according to claim 1, which is adapted to be back illuminated, wherein the substrate has a thinned portion to enable light incident on the back of the substrate to reach the active electrooptical junction.

9. A photodetector circuit according to claim 8, wherein a buried light-shielding layer is provided to prevent light incident on the back of the substrate from reaching the readout circuitry.

10. A photodetector circuit according to claim 8 or 9, wherein a metal contact is connected to a doped layer on the back of the substrate.

11. A photodetector circuit including a photodiode detector and associated readout circuitry, the circuit comprising a semiconductor handle substrate of one conductivity type supporting and electrically insulated from the readout circuitry by an insulating layer, and the photodiode detector comprising a first active region of the opposite conductivity type to the handle substrate incorporated in the handle substrate, a second active region of said one conductivity type incorporated in the handle substrate so that the first and second active regions form a diode, and at least one epitaxial layer on the substrate providing a resistance in series with the diode to control the current-voltage characteristic of the diode.

12. A photodetector circuit according to claim 11, wherein the first and second active regions are formed by implantation of dopant materials of different conductivity types.

13. A photodetector circuit according to claim 11 or 12, wherein there are two epitaxial layers comprising a lower epitaxial layer on the first active region and which is substantially undoped so as to provide a high resistance, and an upper epitaxial layer on the lower epitaxial layer which is of the same conductivity type as the first active region.

14. A photodetector circuit including a photodiode detector and associated readout circuitry, the circuit comprising a semiconductor substrate supporting and electrically insulated from the readout circuitry by an insulating layer, and the photodiode detector having an active electrooptical junction incorporated in a thinned portion of the substrate so as to detect light which is incident on a back surface of the substrate and which is not received by the readout circuitry.

15. A photodetector circuit according to claim 14, wherein a buried light-shielding layer is provided to prevent light which is incident on the back surface of the substrate from reaching the readout circuitry.

16. A photodetector circuit according to claim 14 or 15, wherein a metal contact is connected to a doped layer on the back of the substrate.

* * * * *